United States Patent [19]
Huh et al.

[11] Patent Number: 6,150,220
[45] Date of Patent: Nov. 21, 2000

[54] INSULATION LAYER STRUCTURE AND METHOD FOR MAKING THE SAME

[75] Inventors: Yun-Jun Huh; Nam-Hoon Cho, both of Choongcheongbuk-Do, Rep. of Korea

[73] Assignee: Hyundai Electronics Industries Co., Ltd., Ichon-shi, Rep. of Korea

[21] Appl. No.: 09/195,550

[22] Filed: Nov. 19, 1998

[30] Foreign Application Priority Data

Feb. 27, 1998 [KR] Rep. of Korea .................. 98-6379

[51] Int. Cl.⁷ ............................................. H01L 21/8234
[52] U.S. Cl. .................. 438/275; 438/770; 438/981; 148/DIG. 43; 148/DIG. 163
[58] Field of Search .................. 438/199, 275–299, 438/770–981, FOR 168, FOR 216, FOR 217, FOR 218; 148/DIG. 43, DIG. 163

[56] References Cited

U.S. PATENT DOCUMENTS

| | | |
|---|---|---|
| 4,151,010 | 4/1979 | Goth .................................. 148/1.5 |
| 4,651,406 | 3/1987 | Shimizu et al. ........................ 29/671 |
| 4,851,370 | 7/1989 | Doklan et al. . |
| 5,360,769 | 11/1994 | Thakur et al. . |
| 5,497,021 | 3/1996 | Tada ...................................... 257/392 |
| 5,881,085 | 3/1999 | Jewell ..................................... 372/46 |

*Primary Examiner*—Long Pham
*Attorney, Agent, or Firm*—Fleshner & Kim, LLP

[57] ABSTRACT

A dual thickness gate insulation layer, for use with, e.g., a dual gate MOSFET (Metal Oxide Semiconductor Field Effect Transistor), is formed using a more simplified method and improves the reliability. An impurity layer is formed in the semiconductor substrate, and the impurity layer includes a first portion and a second portion. An insulation layer is grown in the semiconductor substrate, and the insulation layer includes a first layer and a second layer which are different from each other in thickness. The present invention simplifies the insulation layer fabricating steps and improves product reliability.

26 Claims, 3 Drawing Sheets

INSULATION LAYER STRUCTURE AND METHOD FOR MAKING THE SAME

BACKGROUND OF THE INVENTION

1. Field of the Invention

The present invention relates to a semiconductor device and a fabrication method thereof and more particularly, to an insulation layer structure and a method of making the insulation layer structure for a semiconductor device.

2. Background of the Related Art

In order to form a dual thickness gate insulation layer for a dual gate MOSFET (Metal Oxide Semiconductor Field Effect Transistor), an ion implanting method or an etching method is used. The ion implanting methods use either nitrogen or fluorine. The nitrogen ion implanting method is used to form a relatively thin gate insulation layer, while the fluorine ion implanting method is employed to form a relatively thick gate insulation layer. However, gate insulation layers formed by nitrogen ion implanting tend to have a relatively poor reliability, while gate insulation layers formed by fluorine ion implanting may exhibit increased junction leakage current since fluorine defects are formed around junctions of fluorine ion implanted gate insulation layers.

A dual thickness insulation layer may be formed using a dry etching technique or a wet etching technique. FIGS. 1A through 1D are cross-sectional views sequentially illustrating process steps in the formation of a background dual thickness insulation layer, for a semiconductor device, using a dry etching method. As shown in FIG. 1A, a first insulation layer 12 is formed on a semiconductor substrate 11. A first gate electrode layer 13 is formed on the first insulation layer 12. A first photoresist pattern 14 is then formed on the first gate electrode layer 13. See FIG. 1B. Using the first photoresist pattern 14 as a mask in a dry etching method, the first gate electrode layer 13 and the first insulation layer 12 are sequentially removed to form a first gate electrode layer pattern 13a and a first gate insulation layer pattern 12a.

After removing the first photoresist pattern 14, as shown in FIG. 1C, a second insulation layer 15 is formed on the semiconductor substrate 11, the first gate electrode layer pattern 13a, and the first gate insulation layer pattern 12a. The second insulation layer 15 is formed thicker (or thinner) than the first insulation layer 12 such that the first insulation layer 12 and the second insulation layer 15 have different thicknesses. A second gate electrode layer 16 is formed on the second insulation layer 15. A second photoresist pattern 17 is formed on the second gate electrode layer 16.

As shown in FIG. 1D, using the second photoresist pattern 17 as a mask, the second gate electrode layer 16 and the second insulation layer 15 are sequentially removed, by a dry etching method, to form a second gate electrode layer pattern 16a and a second gate insulation layer pattern 15a. Thereafter, the second photoresist pattern 17 is removed.

The method of FIGS. 1A–1D is disadvantageous since formation of the first and second insulation layers having different thicknesses using a dry etching process requires highly complicated fabrication steps. Further, when the first gate electrode layer pattern 13a needs to be doped by ion implanting, the first gate electrode layer pattern 13a absorbs more heat than does the second gate electrode layer pattern 15a, resulting in decreased product reliability. Furthermore, use of a dry etching method for the formation of the dual thickness insulation layer may result in a damaged semiconductor device.

FIGS. 2A through 2C are cross-sectional views sequentially illustrating process steps in a background method of forming a dual thickness insulation layer for a semiconductor device using a wet etching method. In FIG. 2A, a first oxide layer 23 serving as an insulation layer is formed on a semiconductor substrate 21. A first photoresist pattern 25 is formed on the first insulation layer 23. As shown in FIG. 2B, using the first photoresist pattern 25 as a mask, the first oxide layer 23 is etched using a wet etching method, and the first photoresist pattern 25 is removed. As further shown in FIG. 2C, in order to form a dual thickness insulation layer, a second oxide layer 27 is grown on the first oxide layer 23 and the exposed semiconductor substrate 21.

The method of FIGS. 2A–2C is disadvantageous due to numerous repetitions of the growing step and the etching step which may be needed to form the dual thickness insulation layer and it may be difficult to form the required thickness of the insulation layer. Further, the gate insulation layer may be subject to damage when removing the photoresist pattern. Still further, in the case of a relatively thick gate insulation layer, the gate insulation layer should be grown twice for its formation, thereby deteriorating the product reliability.

SUMMARY OF THE INVENTION

An object of the present invention is to solve at least one of the problems and disadvantages of the background art and/or prior art.

Another object of the present invention is to simplify the gate insulation layer fabricating steps.

Another object is to provide an improved reproducibility and product reliability of the gate insulation layer.

To achieve the above described objects in a whole or in parts, there is provided a method for fabricating an insulation layer for a semiconductor device, according to the present invention, the method including the steps of: preparing a semiconductor substrate; forming an impurity layer in the semiconductor substrate, the impurity layer including a first portion of the impurity layer and a second portion of the impurity layer; and growing an insulation layer in the semiconductor substrate, the insulation layer including a first portion of the insulation layer and a second portion of the insulation layer, wherein the first portion and the second portion of the insulation layer differ from each other in thickness.

Further, to achieve the above described objects in a whole or in parts, there is provided an insulation layer structure for a semiconductor device, according to the present invention, wherein the insolation layer structure includes: a first insulation layer formed on a semiconductor substrate, the first insulation layer being irregular, or varying, in thickness; a second insulation layer formed on the first insulation layer, the second insulation layer varying in thickness depending on the thickness of the underlying first insulation layer.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1A:
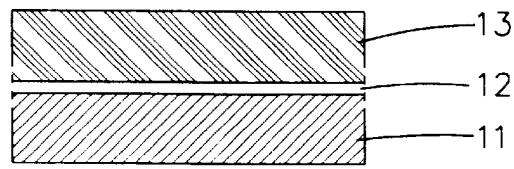
FIGS. 1A through 1D are cross-sectional views sequentially illustrating steps in a background dual process for formation of a thickness insulation layer for a semiconductor device using a dry etching method, according to the prior art.
Figure 1B:
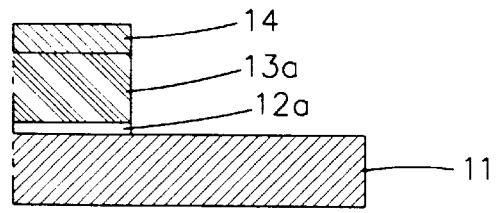
Figure 1C:
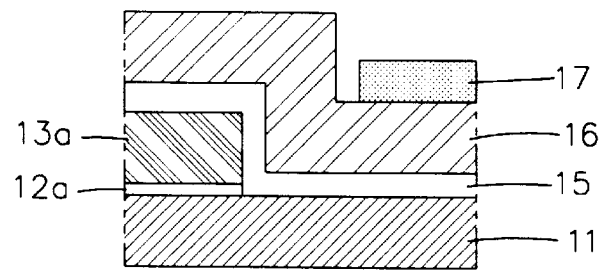
Figure 1D:
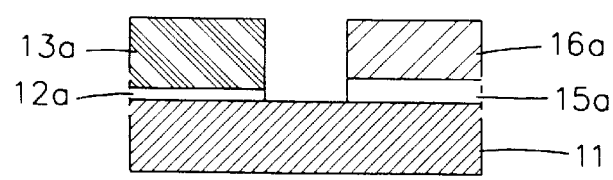
Figure 2A:
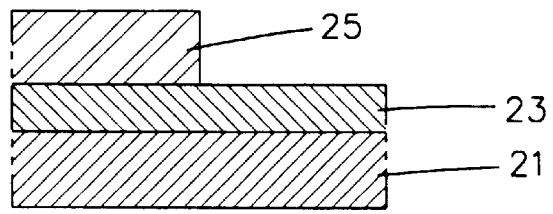
FIGS. 2A through 2C are cross-sectional views sequentially illustrating steps in a background process for formation of a dual thickness insulation layer for a semiconductor device using a wet etching method.
Figure 2B:
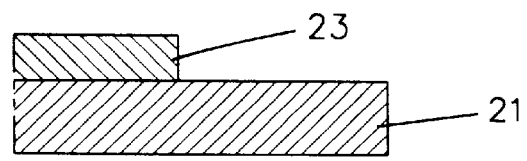
Figure 2C:
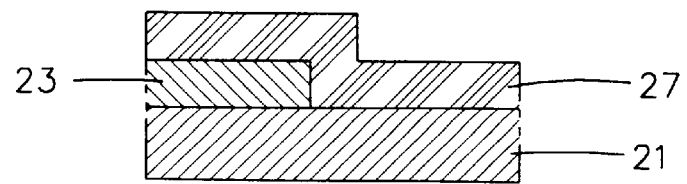
Figure 3A:
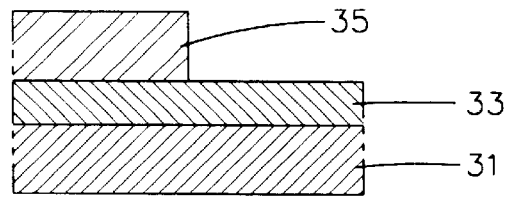
FIGS. 3A through 3D are cross-sectional views illustrating steps in a method for fabricating a dual thickness gate insulation layer according to a preferred embodiment of the present invention.
Figure 3B:
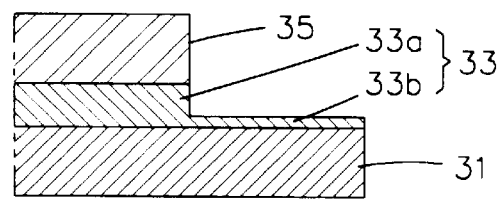
Figure 3C:
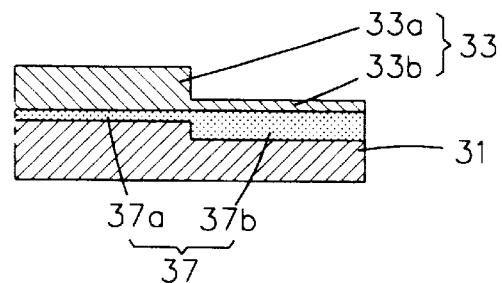
Figure 3D:
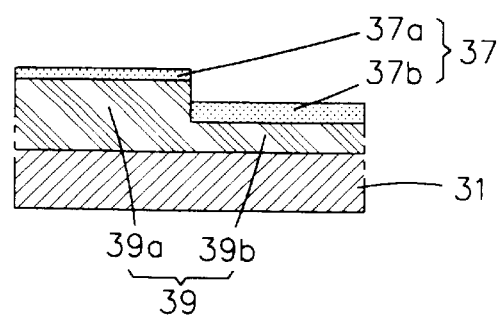

FIGS. 3A through 3D are cross-sectional views illustrating steps in a method for fabricating a dual thickness gate insulation layer for a semiconductor device according to a preferred embodiment of the present invention. As shown in FIG. 3A, a pad layer 33 is formed on a semiconductor substrate 31. A photoresist pattern 35 is formed on the pad layer 33. The photoresist pattern 35 serves as a mask for defining a thick portion 39a and a thin portion 39b of an insulation layer 39 which is to be formed in a later step (FIG. 3D).

In FIG. 3B, using the photoresist pattern 35 as a mask, the pad layer 33 is etched using a wet etching technique. At this time, the pad layer 33 is not completely etched in order to prevent damage from occurring to the semiconductor substrate 31 which lies beneath the etching target, normally, the pad layer 33. Specifically, the pad layer 33 comprises a first portion 33a and a second portion 33b which have different thicknesses. In the particular instance shown in FIG. 3B, the first portion 33a of the pad layer 33 is thicker than the second portion 33b of the pad layer 33.

As shown in FIG. 3C, the photoresist pattern 35 is removed, and the pad layer 33 is cleaned. Subsequently, the semiconductor substrate 31 and the pad layer 33 are annealed under an atmosphere of nitrous gas, such as $N_2O$ and NO. Under such an annealing process, a nitrous impurity layer (or "ion layer") 37 is formed in the semiconductor substrate 31. The nitrous impurity layer 37 comprises a first region 37a and a second region 37b which differ from each other in the amount of impurity contained therein. In other words, due to a thickness difference between the first portion 33a and the second portion 33b of the pad layer 33, the first region 37a of the nitrous impurity layer 37, which comprises a lesser amount of impurity as compared with the second region 37b, is formed just beneath the first portion 33a of the pad layer 33. At the same time, the second region 37b of the nitrous impurity layer 37, which comprises a larger amount of impurity as compared with the first region 37a, is formed just beneath the second portion 33b of the pad layer 33. Also, the first region 37a of the impurity layer 37 is thinner than the second region 37b.

Then, as illustrated in FIG. 3D, the pad layer 33 is removed, and an insulation layer 39 is grown in the semiconductor substrate 31 by thermal oxidation. The insulation layer 39 comprises a first portion 39a and a second portion 39b which are different in thickness. The first portion 39a of the first insulation layer 39 is thicker than the second portion 39b of the first insulation layer 39.

The nitrous impurity layer 37 serves to delay or inhibit the growth of the insulation layer 39. Differences in the relative amount of impurity in the first region 37a as compared with the second region 37b of the nitrous impurity layer 37 allows the relatively thick first portion 39a of the insulation layer 39 to be formed just beneath the first region 37a of the nitrous impurity layer 37, and the relatively thin second portion 39b of the insulation layer 39 to be formed just beneath the second region 37b of the nitrous impurity layer 37. If the insulation layer 39 serves as a first insulation layer in FIG. 3D, the impurity layer 37 formed on the first insulation layer 39 serves as a second insulation layer.

A method for forming an insulation layer for a semiconductor device according to a preferred embodiment of the present invention provides an improved reproducibility of the insulation layer thickness. Because the second insulation layer in the form of an impurity layer exists on the first insulation layer, other impurities are prevented from being implanted, while providing enhanced reliability of the insulation layer. Further, the dual thickness insulation layer of the preferred embodiment is formed in a single growth step, thereby greatly simplifying the process steps and accordingly decreasing the production cost.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method of making a dual thickness insulation layer structure, comprising the steps of:

forming an impurity layer in a substrate, the impurity layer including a first portion having a first amount of an impurity and a second portion having a second amount of the impurity, the first and second portions being formed simultaneously; and growing an insulation layer in the substrate, the insulation layer including a first layer and a second layer formed beneath the first portion and the second portion, respectively, wherein the first layer and the second layer are grown at different growth rates due to the first and second amounts of the impurity such that the first and second layers differ from each other in thickness.

2. The method of claim 1, wherein the impurity layer delays a growth rate of the insulation layer.

3. The method of claim 1, wherein the forming step comprises the steps of:

forming a pad layer on the substrate, the pad layer including a first pad portion and a second pad portion;

annealing, under an atmosphere of an impurity gas, the pad layer and the substrate to form the impurity layer between the pad layer and the substrate; and removing the pad layer.

4. The method of claim 3, wherein the impurity gas is a nitrous gas selected from the group consisting of $N_2O$ and NO.

5. The method of claim 1, wherein the insulation layer comprises an oxide layer.

6. The method of claim 1, wherein the first portion of the impurity layer is thinner than the second portion of the impurity layer.

7. The method of claim 6, wherein the first layer of the insulation layer corresponding to the first portion of the impurity layer is thicker than the second layer of the insulation layer corresponding to the second portion of the impurity layer.

8. The method of claim 3, wherein the first pad portion of the pad layer is initially formed on the semiconductor substrate, and the first pad portion of the pad layer is selectively etched to form the second pad portion of the pad layer.

9. The method of claim 1, wherein the first amount is less than the second amount.

10. The method of claim 8, wherein a thickness of the second pad portion is less than a thickness of the first pad portion.

11. The method of claim 1, wherein the growing step includes simultaneously growing the first layer and the second layer of the insulation layer at different growth rates.

12. A method of making a dual thickness insulation layer structure, comprising:

forming a pad layer on a substrate, the pad layer including a first pad portion and a second pad portion;

annealing, under an atmosphere of an impurity gas, the pad layer and the substrate to form an impurity layer between the pad layer and the substrate, wherein the impurity layer includes a first portion having a first amount of an impurity and a second portion having a second amount of the impurity, and the first amount of the impurity is less than the second amount of impurity;

removing the pad layer; and growing an insulation layer in the substrate, the insulation layer including a first layer and a second layer formed beneath the first portion and the second portion, respectively, wherein the first layer and the second layer differ from each other in thickness.

13. The method of claim 12, wherein the impurity layer delays a growth rate of the insulation layer.

14. The method of claim 12, wherein the impurity gas is a nitrous gas selected from the group consisting of $N_2O$ and NO.

15. The method of claim 12, wherein the insulation layer comprises an oxide layer.

16. The method of claim 12, wherein the first portion of the impurity layer is thinner than the second portion of the impurity layer.

17. The method of claim 12, wherein the first layer of the insulation layer corresponding to the first portion of the impurity layer is thicker than the second layer of the insulation layer corresponding to the second portion of the impurity layer.

18. The method of claim 12, wherein the first pad portion of the pad layer is initially formed on the semiconductor substrate, and the first pad portion of the pad layer is selectively etched to form the second pad portion of the pad layer.

19. The method of claim 12, wherein the first pad portion has a first thickness, and the second pad portion has a second thickness less than the first thickness.

20. The method of claim 12, wherein the step of forming the impurity layer includes simultaneously forming the first portion and the second portion of the impurity layer in a single growth step.

21. The method of claim 12, wherein the growing step includes simultaneously growing the first layer and the second layer of the insulation layer at different growth rates.

22. A method of forming a dual thickness insulation layer structure, comprising the steps of:

forming an impurity layer in a substrate, the impurity layer including a first portion having a first amount of an impurity and a second portion having a second amount of the impurity, wherein the first portion of the impurity layer is thinner than the second portion of the impurity layer; and growing an insulation layer in the substrate, the insulation layer including a first portion and a second portion, wherein the first and second portions of the insulation layer are located beneath the first and second portions of the impurity layer, respectively, and wherein the first and second portions of the insulation layer are grown at different growth rates, such that the first and second portions of the insulation layer have different thicknesses.

23. The method of claim 22, wherein the first and second portions of the impurity layer are formed simultaneously.

24. The method of claim 22, wherein the first portion of the insulation layer is thicker than the second portion of the insulation layer.

25. The method of claim 22, wherein the step of forming the impurity layer comprises performing an annealing step in an impurity gas atmosphere such that the first and second portions of the impurity layer are formed simultaneously.

26. The method of claim 22, wherein the step of forming the impurity layer comprises the steps of:

forming a pad layer on the substrate, the pad layer including a first pad portion and a second pad portion;

annealing the pad layer and the substrate in an impurity gas atmosphere to form the impurity layer; and removing the pad layer.

* * * * *